United States Patent [19]
Lien et al.

[11] Patent Number: 6,103,623
[45] Date of Patent: Aug. 15, 2000

[54] METHOD FOR FABRICATING A TUNGSTEN PLUG STRUCTURE AND AN OVERLYING INTERCONNECT METAL STRUCTURE WITHOUT A TUNGSTEN ETCH BACK OR CMP PROCEDURE

[75] Inventors: Wan-Yih Lien, Hsinchu; Yi-Ping Lee, Taouan, both of Taiwan

[73] Assignee: Vanguard International Semiconductor Corporation, Hsin-Chu, Taiwan

[21] Appl. No.: 09/166,733

[22] Filed: Oct. 5, 1998

[51] Int. Cl.[7] .................................................... H01L 21/44
[52] U.S. Cl. ...................... 438/669; 438/672; 438/673; 438/636
[58] Field of Search .................................... 438/547, 636, 438/637, 669, 672, 700

[56] References Cited

U.S. PATENT DOCUMENTS

| 5,326,431 | 7/1994 | Kadomura | 156/659.1 |
|---|---|---|---|
| 5,387,556 | 2/1995 | Xiaobing et al. | 437/228 |
| 5,407,861 | 4/1995 | Marangon et al. | 437/192 |
| 5,523,627 | 6/1996 | Abe et al. | 257/774 |
| 5,700,739 | 12/1997 | Chiang et al. | 438/655 |
| 5,702,983 | 12/1997 | Shinohara . | |
| 5,767,015 | 6/1998 | Tabara | 438/654 |

*Primary Examiner*—Caridad Everhart
*Attorney, Agent, or Firm*—George O. Saile; Stephen B. Ackerman

[57] ABSTRACT

A process for forming a tungsten plug structure, in a contact hole, without recessing of the tungsten plug, or of the adhesive and barrier layers, located on the sides of the contact hole, during the tungsten plug patterning procedure, has been developed. The process features a two stage, in situ RIE procedure, in which a photoresist shape, larger in width than the diameter of the contact hole, is used as a mask to allow patterning of an aluminum based layer, of an underlying tungsten, and of the barrier and adhesive layers. The result of the two stage, in situ RIE procedure is an aluminum based interconnect structure, overlying a tungsten plug structure, with the tungsten plug structure comprised of a tungsten plug, in a contact hole, protected during the patterning procedure by the overlying aluminum based interconnect structure.

23 Claims, 3 Drawing Sheets

METHOD FOR FABRICATING A TUNGSTEN PLUG STRUCTURE AND AN OVERLYING INTERCONNECT METAL STRUCTURE WITHOUT A TUNGSTEN ETCH BACK OR CMP PROCEDURE

BACKGROUND OF THE INVENTION (1) Field of the Invention

The present invention relates to a method used to fabricate semiconductor memory devices, and more specifically to a method used to define a metal contact plug structure, and an overlying metal interconnect structure, using a two step, in situ etch procedure.

(2) Description of Prior Art

The trend to continually shrink the dimensions of memory chips, necessitates the use of more sophisticated structures, used for contact to underlying conductive regions, in a semiconductor substrate, and used to contact and communicate with overlying metal interconnect structures. A conductive metal plug structure, usually comprised of tungsten, or doped polysilicon, has been used for these purposes. The metal plug is formed in a contact hole, in an insulator layer, with the metal plug overlying, and contacting, a conductive region in the semiconductor substrate, such as a source/drain region of a metal oxide semiconductor field effect transistor, (MOSFET). The procedure used to create metal plugs can however prove difficult to control. For example, microloading effects, or variations in the reactive ion etching, (RIE), removal rate of a specific metal, employed to remove unwanted metal from the top surface of an insulator layer, while forming the metal plug in a contact hole in the same insulator layer, can result in an overetching of metal, in areas in which the density of contacts holes is large, while leaving unwanted metal still remaining on the top surface of the insulator region, in non-dense regions. Therefore when attempting to clear unwanted metal, in non-dense regions, overetching of the metal plug, and of the adhesion and barrier layers, used between the metal plug, and the sides of the contact hole, can occur in the dense regions. The result of recessed metal plugs, and removed adhesion and barrier layers, can degrade yield, or result in reliability problems.

This invention will offer a process in which a metal plug is formed without subjection to either a RIE or a chemical mechanical procedure, for definition of the metal plug. This invention features the deposition of the adhesion and barrier layer, as well as the in situ deposition of the metal, completely filling the contacts holes. However prior to definition of the metal plug, an overlying metal interconnect layer, and an anti-reflective coating, (ARC), are deposited. After patterning of the ARC and metal interconnect layer, via photolithographic and selective anisotropic RIE procedures, using a first etch chemistry, with the selective RIE procedure stopping on the metal plug layer, the etch chemistry is changed, and a second selective RIE procedure is performed, using a second etch chemistry, to define the metal plug, using the same photoresist shape as a mask. This novel procedure results in the in situ definition of a metal interconnect structure, larger in width than the width or diameter of the contact hole, now embedded with the metal plug, and also results in the definition of a metal plug structure, formed without directly exposing the metal plug, in the contact hole, to the patterning procedure. Prior art, such as Tabara, in U.S. Pat. No. 5,767,015, describes a method for forming a metal plug structure, but does not show the present invention, in which an in situ RIE procedure is used for definition of both a metal interconnect, and a metal plug structure, without directly exposing the metal plug structure, in a contact hole, to the RIE procedure.

SUMMARY OF THE INVENTION

It is an object of this invention to create a metal plug, in a contact hole, connecting an overlying metal interconnect structure, to an active device region in a semiconductor substrate.

It is another object of this invention to use a thin adhesive layer, and a thin barrier layer, on the sides of the contact hole, interfacing the metal plug, in the region in which the metal plug is located in the contact hole.

It is still another object of this invention to in situ pattern an overlying metal interconnect structure, and the metal plug, larger in width than the width or diameter of the contact hole, thus not directly subjecting the region of the metal plug, or the adhesive and barrier layers, located in the contact hole, to a dry etching patterning procedure.

It is still yet another object of this invention to pattern the metal interconnect structure using a first dry etch chemistry, end pointing on exposure of the metal used for the metal plug structure, followed by an in situ patterning of the metal plug structure, using a second dry etch chemistry.

In accordance with the present invention, a process is described for in situ patterning of an overlying metal interconnect structure, and an underlying metal plug structure, using a two stage, dry etching procedure, without directly exposing the metal plug structure, in a contact hole, and the adhesive and barrier layers, on the sides of the contact hole, to either stage of the dry etch, patterning procedure. A conductive region in a semiconductor substrate such as a source/drain region of an transfer gate transistor, is provided. A contact hole, in an insulator layer, is formed, exposing the top surface of the source/drain region. A chemical vapor deposition of a thin titanium, adhesive layer, and of a thin titanium nitride, barrier layer, is followed by an in situ, chemical vapor deposition of a tungsten layer, with the tungsten layer completely filling the contact hole. A plasma vapor deposition of an aluminum based layer, and an overlying titanium nitride, ARC layer, are next performed. A photoresist shape, larger in width than the diameter of the contact hole, is used as a mask to create an aluminum based interconnect structure, with an overlying titanium nitride ARC shape, overlying the tungsten layer, using a first stage of an anisotropic RIE procedure, via the use of a chlorine based etchant. The second stage of the anisotropic RIE procedure, results in the patterning of the tungsten plug, as well as the patterning of the barrier and adhesive layers, performed in situ, via an anisotropic RIE procedure, using an $SF_6$ based etchant, and using the photoresist shape, and the aluminum based interconnect structure as an etch mask. Removal of the photoresist shape, and of the titanium nitride ARC layer, presents an aluminum based interconnect structure, overlying a tungsten plug structure, formed without directly subjecting the portion of the tungsten plug, or the portions of the adhesive and barrier layers, located in the contact hole, to either stage of the anisotropic RIE procedure.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

The method of forming an overlying metal interconnect structure, and an underlying metal plug structure, using an in situ, two stage, anisotropic RIE procedure, featuring the absence of directly subjecting the portion of the metal plug, and the portions of the adhesive and barrier layers, located in the contact hole, to the two staged, anisotropic RIE procedure, will now be described in detail. The metal interconnect structure, and metal plug structure, described in this invention, is shown applied to a source/drain region of an N channel, metal oxide semiconductor field effect transistor, (MOSFET), device. However the metal interconnect structure, and the metal plug structure, described in this invention, can be applied to source/drain regions of P channel devices, or to other active regions in a semiconductor substrate. In addition this invention can also be used to form a metal interconnect, and a metal plug structure, to an underlying metal interconnect structure, exposed at the bottom of a via hole, in an interlevel dielectric layer.

Figure 1:
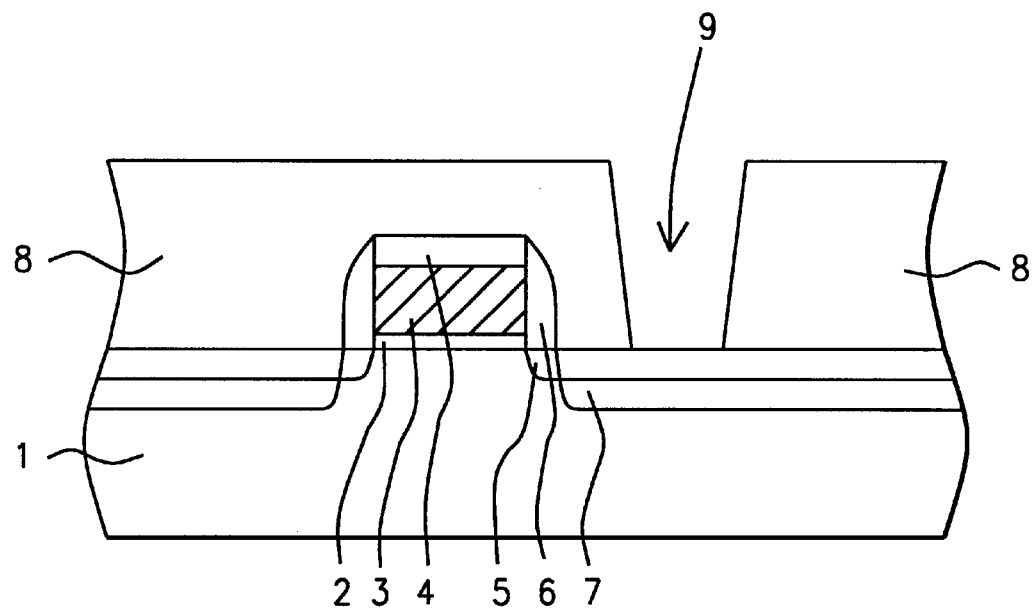
FIGS. 1–6, which schematically, in cross-sectional style, show the key stages of fabrication, used to create the tungsten plug structure, and an overlying aluminum based interconnect structure, using a two stage, anisotropic RIE procedure.

FIG. 1, schematically describes the formation of a transfer gate transistor, as well as the contact hole used for the subsequent metal plug structure. A P type, semiconductor substrate 1, comprised of single crystalline silicon, having a <100> crystallographic orientation, is used. A gate insulator layer 2, of silicon dioxide, is thermally grown to a thickness between about 35 to 90 Angstroms, followed by the deposition of a polysilicon layer 3, at a thickness between about 500 to 2000 Angstroms, using a low pressure chemical vapor deposition, (LPCVD), procedure. Polysilicon layer 3, is doped using either an in situ doping procedure, via the addition of either arsine or phosphine, to silane ambient, or polysilicon layer 3, can be deposited intrinsically, then doped via implantation of either phosphorous or arsenic ions. If desired, to lower word resistance, a polycide layer, comprised of an overlying metal silicide layer, such as tungsten silicide, and an underlying polysilicon layer, can be used in place of polysilicon layer 3. Insulator layer 4, comprised of either silicon oxide, or silicon nitride, is deposited using either LPCVD or plasma enhanced chemical vapor deposition, (PECVD), procedures, to a thickness between about 500 to 2000 Angstroms. Conventional photolithographic and anisotropic RIE procedures, using either $CHF_3$ or $CF_4$ as an etchant for insulator layer 4, and using $Cl_2$ as an etchant for either polysilicon or polycide layer 3, are used to create the gate structure, of the transfer gate transistor, schematically displayed in FIG. 1.

After removal of the photoresist shape, used for definition of the gate structure, via plasma oxygen ashing and careful wet cleans, a lightly doped source/drain region 5, is formed via ion implantation of phosphorous or arsenic. Insulator spacers 6, comprised of either silicon oxide or silicon nitride, are next formed, via the deposition of either silicon oxide, or silicon nitride, at a thickness between about 300 to 800 Angstroms, using either LPCVD or PECVD procedures, followed by an anisotropic RIE procedure, using either $CHF_3$ or $CF_4$ as an etchant. A heavily doped source/drain region 7, is then formed, again via ion implantation of arsenic or phosphorous. This is also schematically shown in FIG. 1. An insulator layer 8, of silicon oxide, is next deposited using LPCVD or PECVD procedures, to a thickness between about 5000 to 18000 Angstroms. Conventional photolithographic and RIE procedures, using either $CHF_3$, $CF_4$, or $C_4F_8$, as an etchant, are used to create contact hole 9, exposing the top surface of heavily doped source/drain region 7. The diameter, at the top of contact hole 9, schematically shown in FIG. 1, is between about 500 to 5000 Angstroms. Removal of the photoresist shape, used to create contact hole 9, is accomplished via plasma oxygen ashing and careful wet cleans.

Figure 2:
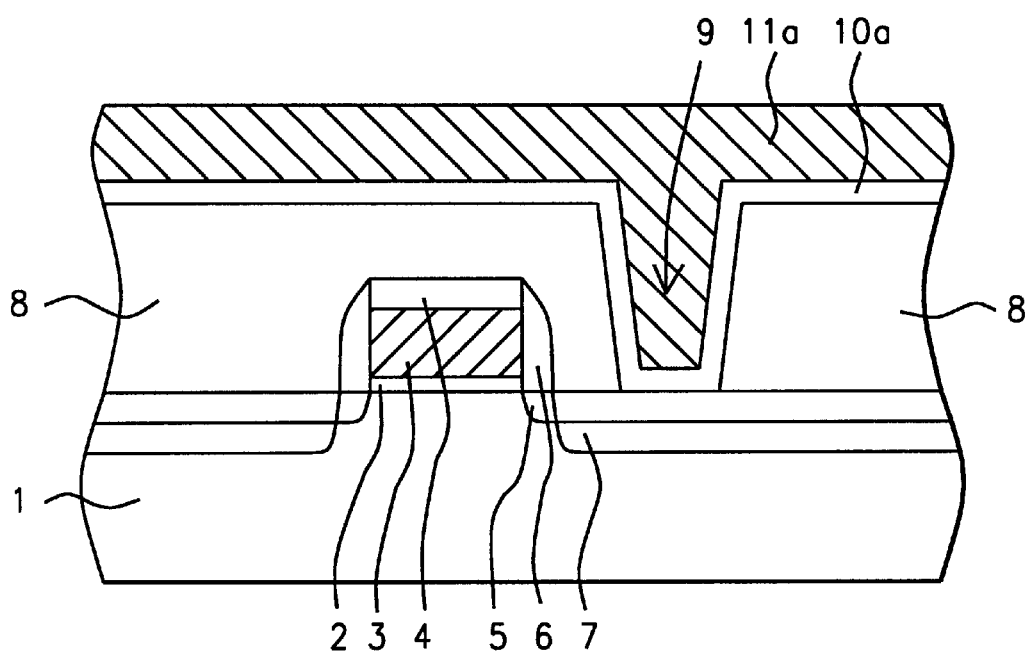

The depositions of the adhesive and barrier layers, are next addressed. The deposition of these layers is accomplished via chemical vapor deposition, (CVD), procedures, resulting in improved continuity, or step coverage, of these layers on the sides of contact hole 9, when compared to other deposition modes, such as plasma vapor deposition. The composite adhesive and barrier layer 10a, deposited via CVD procedures, is comprised of an underlying titanium adhesive layer, at a thickness between about 50 to 100 Angstroms, deposited using $TiCl_4$ as a source, followed by an in situ deposition, of an overlying titanium nitride, barrier layer at a thickness between about 100 to 200 Angstroms, using $TiCl_4$ and $NH_3$ as reactants. The composite adhesive and barrier layer 10a, is deposited at a temperature between about 400 to 700° C. Next a tungsten layer 11a, is in situ deposited, via CVD procedures, to a thickness between about 4000 to 6000 Angstroms, using tungsten hexafluoride as a source, completely filling contact hole 9. The result of these depositions are schematically shown in FIG. 2.

Figure 3:
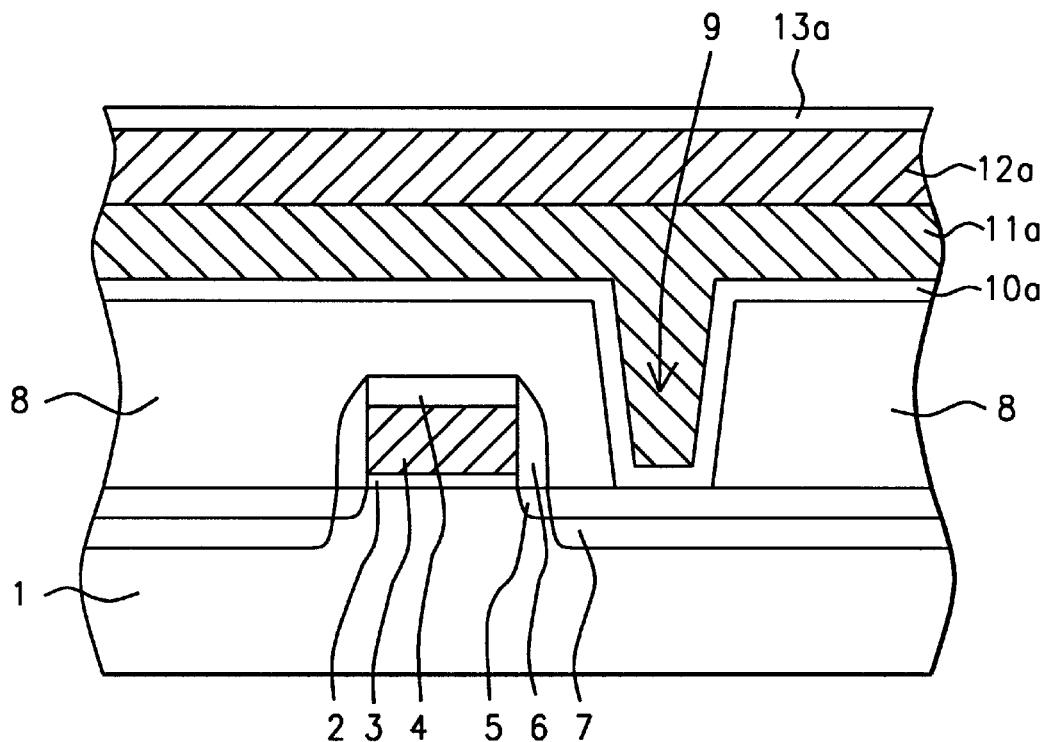

A major feature of this invention is to delay the patterning of a tungsten plug structure, to a stage in the process in which an overlying interconnect structure is first patterned, then using the metal interconnect structure, or the photoresist shape used to define the metal interconnect structure, as the mask for the tungsten plug definition. This is accomplished by next depositing an aluminum based layer 12a, on underlying tungsten layer 11a, via PVD procedures, at a thickness between about 4500 to 8000 Angstroms, with aluminum based layer 12a, containing between about 0.5 to 2.0 weight percent copper. An overlying titanium nitride layer 13a, used as an anti-reflective coating, (ARC), for subsequent photolithographic patterning procedures, is next deposited, using PVD procedures, to a thickness between about 200 to 400 Angstroms. The result of the PVD procedures, is schematically shown in FIG. 3.

Figure 4:
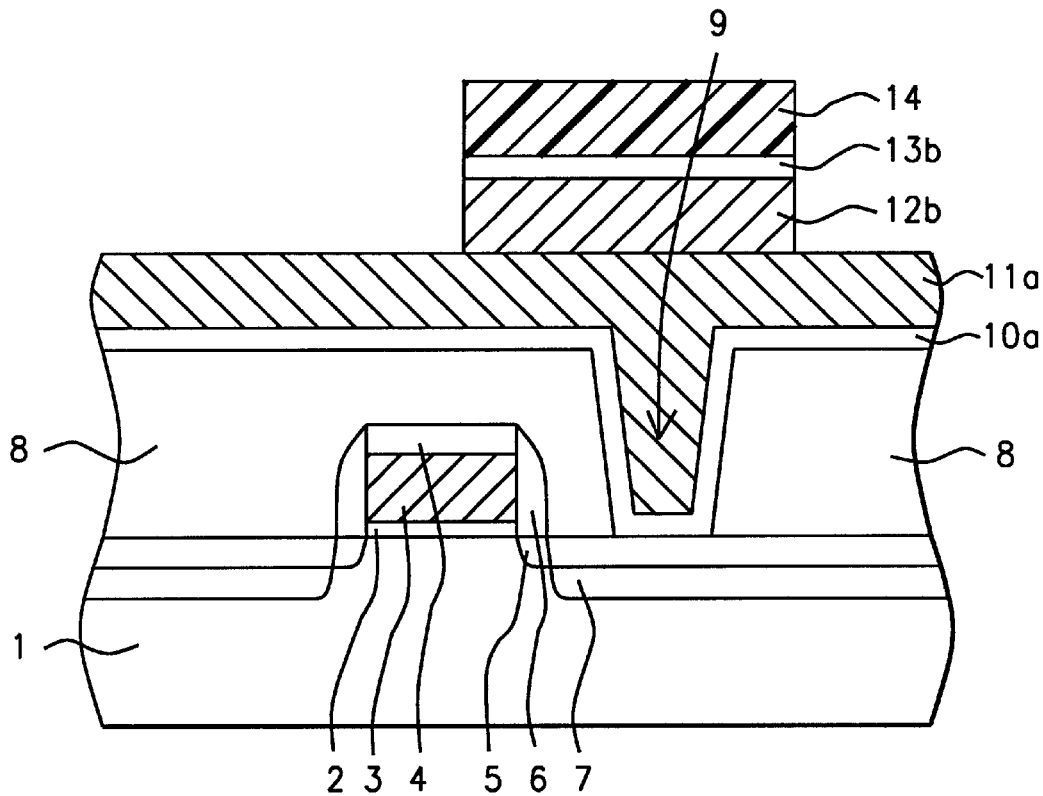

Photoresist shape 14, schematically shown in FIG. 4, is next formed and used as a mask to create aluminum based, interconnect structure 12b. The width of photoresist shape 14, is between about 1500 to 4000 Angstroms, greater than the diameter of the underlying contact hole 9. A first stage of an anisotropic RIE procedure is next performed, using a chlorine based etchant, resulting in the formation of titanium nitride, ARC shape 13b, and aluminum based, interconnect structure 12b, shown schematically in FIG. 4. The etch chemistry, for the first stage of the anisotropic RIE procedure, is comprised of between about 20 to 80% chlorine, and between about 20 to 80% $BCl_3$. Additive reactants, such as argon, nitrogen, $CHF_3$, and $CH_4$, between about 0 to 40%, can also be included in the etching ambient, of the first stage of the anisotropic RIE procedure, performed at a pressure between about 6 to 20 mtorr. The use of the described etch chemistry, used for the first stage of the anisotropic RIE procedure, with an etch rate selectivity allowing a greater removal rate for the aluminum based layer, then for tungsten, allows the end point to easily be established with the appearance of tungsten layer 11a.

Figure 5:
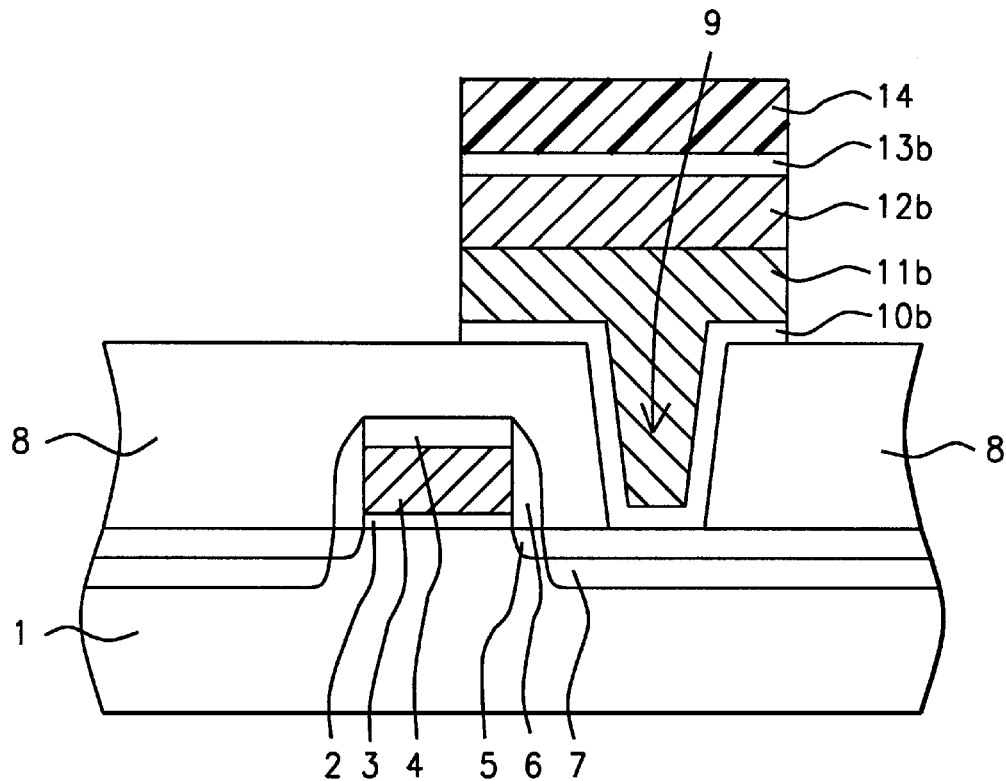

The second stage of the anisotropic RIE procedure, is next addressed, and described schematically in FIG. 5. An in situ patterning procedure is used to define tungsten plug structure 11b, and composite adhesive and barrier shape 10b, again using photoresist shape 14 as a mask. The second stage of the anisotropic RIE procedure, uses $SF_6$ as an etchant, which removes the regions of tungsten layer 11a, and the underlying composite adhesive and barrier layer 10a, not covered by photoresist shape 14, or not covered by aluminum based, interconnect structure 12b. The second stage of the anisotropic RIE procedure, performed in situ, in the same RIE apparatus used for the first stage of the anisotropic RIE procedure, does not expose portions of tungsten, or portions of the composite adhesive and barrier layer, located in contact hole 9, to the patterning procedure, since photoresist shape 14, and aluminum based, interconnect structure 12b, overlying contact hole 9, completely protect the narrower contact hole 9. If contact hole 9, was not protected during this procedure, an over etch RIE cycle, needed to remove possible regions of thicker tungsten, could have resulted in the unwanted recessing of the tungsten plug, and of the adhesive and barrier layers, exposed in the contact hole.

Another iteration of this invention is the removal of photoresist shape 14, prior to the second stage of the anisotropic RIE procedure. The greater removal rate of tungsten, compared to aluminum, in an $SF_6$ ambient, allows the creation of tungsten plug structure 11b, to be realized, using only aluminum based, interconnect structure 12b, as a mask. The exposed titanium nitride ARC shape 13b, is consumed during this non-photoresist shape, second stage anisotropic RIE procedure.

Figure 6:
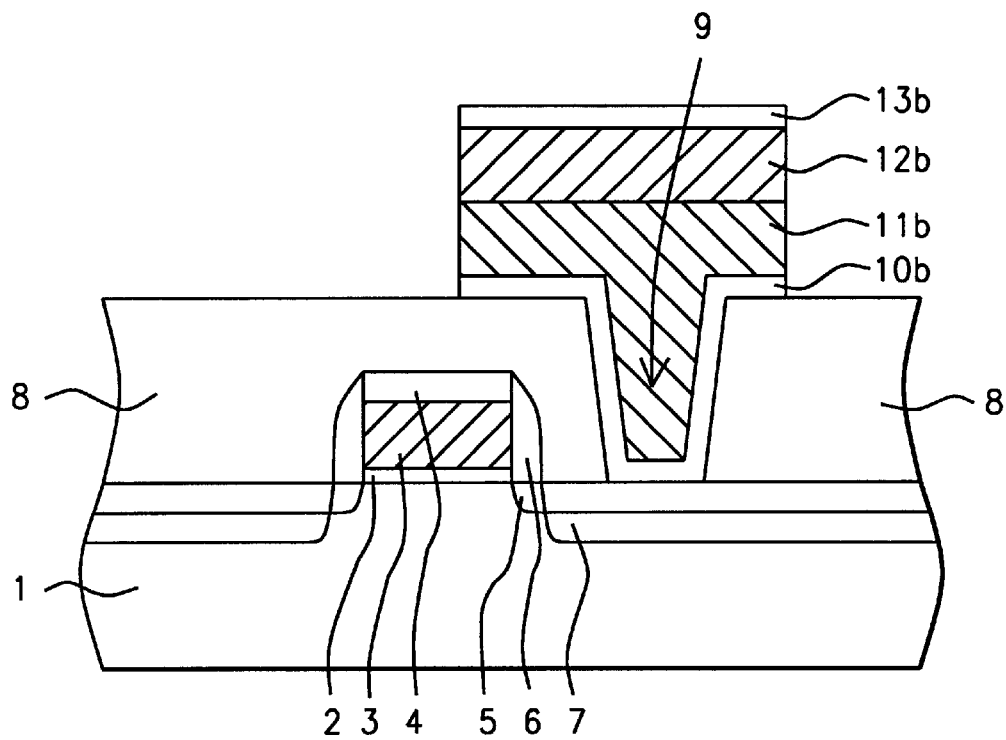

Finally, FIG. 6, schematically shows the completion of the metal interconnect structure, and the underlying metal plug structure, after removal of photoresist shape 14, using plasma oxygen ashing and careful wet cleans. Again if the iteration, using the metal interconnect structure as a mask for patterning of the metal plug structure, were used, titanium nitride ARC shape 13b, would not be present.

While this invention has been particularly shown and described with reference to the preferred embodiments thereof, it will be understood by those skilled in the art that various changes inform and details may be made without departing from the spirit and scope of this invention.

What is claimed is:

1. A method for fabricating a metal interconnect structure, and a underlying metal plug structure, on a semiconductor substrate, comprising the steps of:

providing a conductive region in said semiconductor substrate;

forming a contact hole, with a diameter at the top of said contact hole between about 500 to 5000 Angstroms, in an insulator layer, exposing the top surface of said conductive region in said semiconductor substrate;

depositing a composite layer on the top surface of said insulator layer, and on the sides of said contact hole, with said composite layer comprised of an underlying adhesive layer, and an overlying barrier layer;

depositing a metal plug layer on composite layer, completely filling said contact hole;

depositing an aluminum based metal layer on said metal plug layer;

depositing an anti-reflective coating, (ARC), on said aluminum based metal layer;

forming a photoresist shape on said ARC layer, in a region directly overlying said contact hole, and with the width of said photoresist shape, larger than the diameter of underlying, said contact hole;

performing a first dry etch procedure, in a first dry etching ambient, in which the removal rate of said aluminum based metal layer is greater than the removal rate of said metal plug layer, using said photoresist shape as a mask, forming an aluminum based interconnect structure, with an overlying ARC shape, overlying said metal plug layer, with the width of said aluminum based interconnect structure, larger than said diameter at the top of said contact hole;

removing said photoresist shape; and performing a second dry etch procedure, in a second dry etching ambient, in which the removal rate of said metal plug layer is greater than the removal rate of said aluminum based interconnect structure, using said aluminum based interconnect structure as a mask, forming a metal plug structure, and an underlying composite layer shape, comprised of said barrier layer, and of said adhesive layer, and with a first portion of said metal plug structure comprised of a metal plug, on a first portion of said composite layer shape, in said contact hole, and comprised of a second portion of said metal plug structure, on a second portion of said composite layer shape, located on the top surface of said insulator layer.

2. The method of claim 1, wherein said conductive region, in said semiconductor substrate, is a heavily doped source/drain region, obtained via ion implantation of arsenic or phosphorous.

3. The method of claim 1, wherein said insulator layer is a silicon oxide layer, deposited using LPCVD or PECVD procedures, to a thickness between about 5000 to 18000 Angstroms.

4. The method of claim 1, wherein said contact hole is formed in said insulator layer, via RIE procedures, using either $CHF_3$, $CF_4$, or $C_4F_8$, as an etchant, with the diameter of said contact hole, between about 500 to 5000 Angstroms.

5. The method of claim 1, wherein said underlying adhesive layer, of said composite layer, is a titanium layer, obtained using a CVD procedure, at a thickness between about 50 to 100 Angstroms, using $TiCl_4$ as a source.

6. The method of claim 1, wherein said overlying barrier layer, of said composite layer, is a titanium nitride layer, obtained via a chemical vapor deposition, (CVD), procedure, at a thickness between about 100 to 200 Angstroms, using $TiCl_4$ and $NH_3$ as reactants.

7. The method of claim 1, wherein said metal plug layer, is tungsten, obtained via a CVD procedure, to a thickness between about 4000 to 6000 Angstroms, using tungsten hexafluoride as a source.

8. The method of claim 1, wherein said aluminum based layer, is obtained via a plasma vapor deposition, (PVD), procedure, at a thickness between about 4500 to 8000 Angstroms, containing between about 0.5 to 2.0 weight percent copper.

9. The method of claim 1, wherein said ARC layer is a titanium nitride layer, obtained via PVD procedures, to a thickness between about 200 to 400 Angstroms.

10. The method of claim 1, wherein said photoresist shape has a width between about 1500 to 4000 Angstroms.

11. The method of claim 1, wherein said first dry etch procedure, is an anisotropic RIE procedure, forming said ARC layer shape, and forming underlying, and said aluminum based interconnect structure, using said first dry etching ambient, comprised of between about 20 to 80% $Cl_2$, between about 20 to 80% $BCl_3$, and between about 0 to 40% additional reactants from a group including argon, nitrogen, $CHF_3$, and $CH_4$, and with said first dry etching procedure performed at a pressure between about 6 to 20 mtorr.

12. The method of claim 1, wherein said second dry etch procedure, is an anisotropic RIE procedure, forming said metal plug structure in said contact hole, and on the top surface of said insulator layer, using said second dry etching ambient, comprised of $SF_6$ as an etchant.

13. A method for fabricating an aluminum based interconnect structure, and an underlying tungsten plug structure, on a semiconductor substrate, via an in situ, dry etching procedure, and without exposing the portion of the tungsten plug structure, in a contact hole, to the in situ dry etching procedure, comprising the steps of:

providing a transfer gate transistor, comprised of a polysilicon gate structure, on a gate insulator layer, and a source/drain region;

depositing a silicon oxide layer on said transfer gate transistor;

forming a contact hole in said silicon oxide layer, with a diameter at the top of said contact hole between about 500 to 5000 Angstroms, exposing a portion of the top surface of said source/drain region;

depositing a titanium layer on the top surface of said silicon oxide layer, and on the sides of said contact hole;

depositing a titanium nitride barrier layer on said titanium layer;

depositing a tungsten layer on said titanium nitride barrier layer, completely filling said contact hole;

depositing an aluminum based metal layer on said tungsten layer;

depositing a titanium nitride anti-reflective coating, (ARC), layer, on said aluminum based metal layer;

forming a photoresist shape on said titanium nitride ARC layer, with the width of said photoresist shape larger than the diameter at the top of said contact hole, and with said photoresist shape completely overlying said contact hole;

performing a first anisotropic RIE procedure, using $Cl_2$ based etchants, in which the removal rate of said titanium nitride ARC layer, and of said aluminum based metal layer is greater than the removal rate of said tungsten layer, using said photoresist shape as a mask, to create said aluminum based interconnect structure, comprised with an overlying titanium nitride ARC shape, and with said aluminum based interconnect structure overlying said tungsten layer;

in situ patterning of said tungsten layer, of said titanium barrier layer, and of said titanium layer, via a second anisotropic RIE procedure, using $SF_6$ as an etchant, and using said photoresist shape as a mask, to create said tungsten plug structure, comprised of a tungsten plug, on said titanium nitride barrier layer, in said contact hole, and comprised of a portion of said tungsten layer, a portion of said titanium barrier layer, and a portion of said titanium layer, on the top surface of said silicon oxide layer, directly underlying said aluminum based interconnect structure; and removing said photoresist shape.

14. The method of claim 13, wherein said second silicon oxide layer is deposited using LPCVD or PECVD procedures, to a thickness between about 5000 to 18000 Angstroms.

15. The method of claim 13, wherein said contact hole is formed in said silicon oxide layer, via a RIE procedure, using either $CHF_3$, $CF_4$, or $C_4F_8$, as an etchant, and with said contact hole having a diameter between about 500 to 5000 Angstroms.

16. The method of claim 13, wherein said titanium layer is obtained using chemical vapor deposition, (CVD), procedures, to a thickness between about 50 to 100 Angstroms, using $TiCl_4$ as a source.

17. The method of claim 13, wherein said titanium nitride barrier layer is obtained via CVD procedures, to a thickness between about 100 to 200 Angstroms, using $TiCl_4$ and $NH_3$ as reactants.

18. The method of claim 13, wherein said tungsten layer is obtained via CVD procedures, to a thickness between about 4000 to 6000 Angstroms, using tungsten hexafluoride as a source.

19. The method of claim 13, wherein said aluminum based metal layer is obtained via plasma vapor deposition, (PVD), at a thickness between about 4500 to 8000 Angstroms, with said aluminum based metal layer containing between about 0.5 to 2.0 weight percent copper.

20. The method of claim 13, wherein said titanium nitride ARC layer is obtained via PVD procedures, to a thickness between about 200 to 400 Angstroms.

21. The method of claim 13, wherein said photoresist shape is formed with a width between about 1500 to 4000 Angstroms.

22. The method of claim 13, wherein said $Cl_2$ based etchants, used with said first anisotropic RIE procedure, are comprised of between about 20 to 80% $Cl_2$, between about 20 to 80% $BCl_3$, and between about 0 to 40% additives, chosen from a group that includes $CHF_3$, $CH_4$, argon, and nitrogen.

23. The method of claim 13, wherein said first anisotropic RIE procedure, is performed at a pressure between about 6 to 20 mtorr.

* * * * *